(12) United States Patent
Feilchenfeld et al.

(10) Patent No.: US 9,786,606 B2
(45) Date of Patent: Oct. 10, 2017

(54) SEMICONDUCTOR STRUCTURES WITH ISOLATED OHMIC TRENCHES AND STAND-ALONE ISOLATION TRENCHES AND RELATED METHOD

(71) Applicant: GLOBALFOUNDRIES Inc., Grand Cayman (KY)

(72) Inventors: Natalie B. Feilchenfeld, Jericho, VT (US); BethAnn Lawrence, Essex Junction, VT (US); Yun Shi, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/066,374

(22) Filed: Mar. 10, 2016

(65) Prior Publication Data
US 2016/0190067 A1    Jun. 30, 2016

Related U.S. Application Data

(62) Division of application No. 14/288,852, filed on May 28, 2014, now Pat. No. 9,324,632.

(51) Int. Cl.
*H01L 21/76*      (2006.01)
*H01L 23/48*      (2006.01)
(Continued)

(52) U.S. Cl.
CPC .......... *H01L 23/535* (2013.01); *H01L 21/743* (2013.01); *H01L 21/76224* (2013.01);
(Continued)

(58) Field of Classification Search
CPC .................................................... H01L 23/481
See application file for complete search history.

(56) References Cited

U.S. PATENT DOCUMENTS 4,549,927 A   10/1985   Goth et al.
5,217,920 A   6/1993   Mattox et al.
(Continued)

FOREIGN PATENT DOCUMENTS

CN    101257029 A    9/2003
CN    1612357 A    5/2005
CN    100524783 A    8/2009

OTHER PUBLICATIONS

Ghyka, Notice of Allowance and Fee(s) Due for U.S. Appl. No. 14/288,852 dated Jan. 15, 2016, 5 pages.
(Continued)

*Primary Examiner* — Alexander Ghyka
(74) *Attorney, Agent, or Firm* — Michael LeStrange; Hoffman Warnick LLC

(57) ABSTRACT

A method of forming a semiconductor structure in a semiconductor-on-insulator (SOI) substrate and semiconductor structure so formed are provided. The SOI substrate includes a semiconductor layer; a bulk semiconductor region underlying the semiconductor layer; and an insulation layer between the two. The structure includes first and second openings each having sidewalls, each of the first opening and the second opening formed substantially simultaneously and extending from a top surface of the semiconductor layer through the semiconductor layer and through the insulation layer to the conductive region; an insulating material adapted to provide electrical insulation to at least a portion of the side walls of the first opening; a semiconductor material at least partially filling the first opening, the semiconductor material defining an ohmic contact trench providing electrical contact with the semiconductor region; and an insulating material disposed in the second opening and defining a device isolation trench.

11 Claims, 18 Drawing Sheets

(51) Int. Cl.
*H01L 21/768* (2006.01)
*H01L 23/535* (2006.01)
*H01L 21/762* (2006.01)
*H01L 29/06* (2006.01)
*H01L 27/12* (2006.01)
*H01L 21/74* (2006.01)
*H01L 23/528* (2006.01)

(52) U.S. Cl.
CPC .. *H01L 21/76229* (2013.01); *H01L 21/76898* (2013.01); *H01L 23/481* (2013.01); *H01L 23/528* (2013.01); *H01L 27/1207* (2013.01); *H01L 29/0649* (2013.01); *H01L 2924/0002* (2013.01)

(56) References Cited

U.S. PATENT DOCUMENTS

| | | | |
|---|---|---|---|
| 5,314,841 | A | 5/1994 | Brady et al. |
| 6,251,734 | B1 | 6/2001 | Grivna et al. |
| 6,498,372 | B2 | 12/2002 | Rankin et al. |
| 7,348,256 | B2 | 3/2008 | Miller, Jr. et al. |
| 8,293,615 | B2 | 10/2012 | Cheng et al. |
| 8,415,743 | B2 | 4/2013 | Cai et al. |
| 2009/0057911 | A1 | 3/2009 | Hoffmann et al. |

OTHER PUBLICATIONS

Ghyka, Office Action Communications for U.S. Appl. No. 14/288,852 dated Jul. 17, 2015, 16 pages.

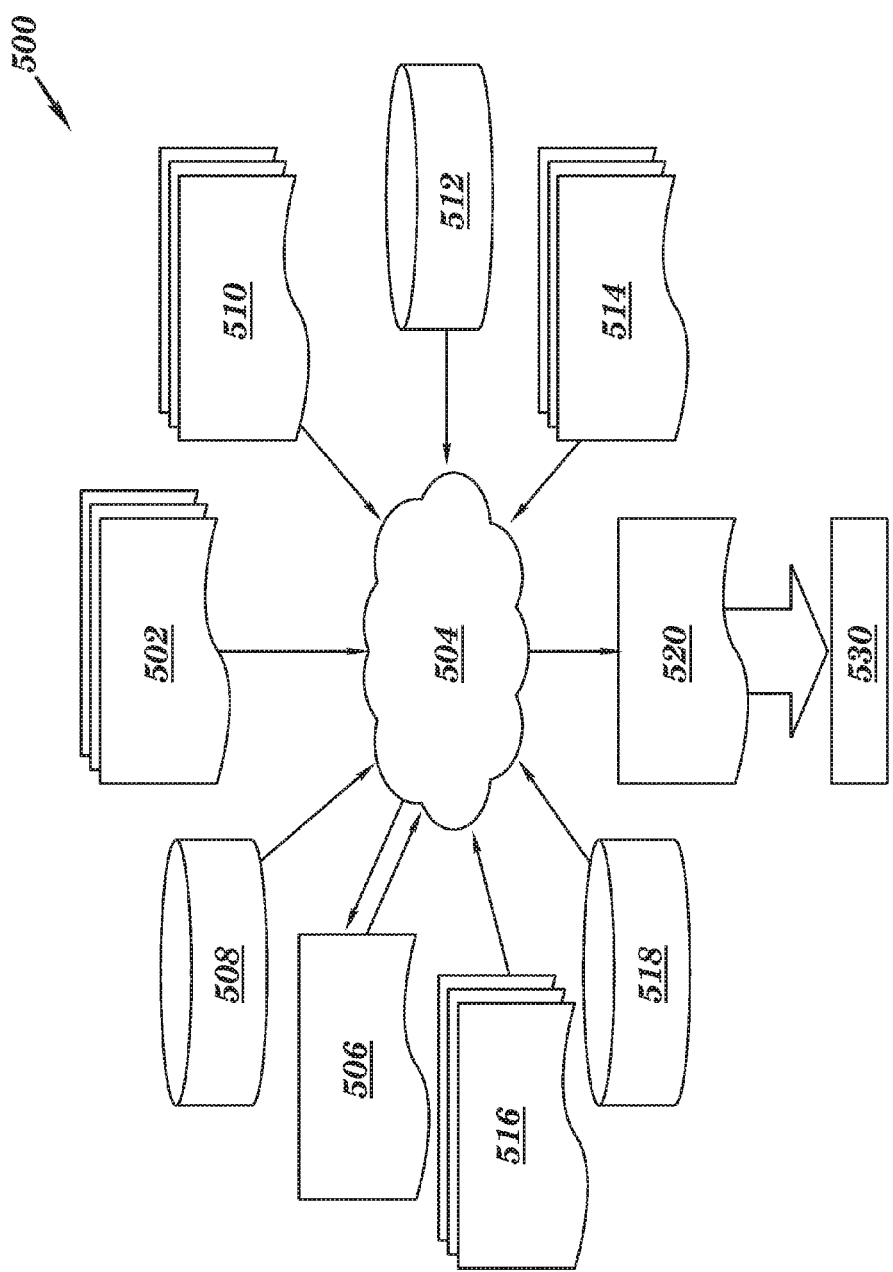

SEMICONDUCTOR STRUCTURES WITH ISOLATED OHMIC TRENCHES AND STAND-ALONE ISOLATION TRENCHES AND RELATED METHOD

BACKGROUND OF THE INVENTION

Technical Field

The present invention generally relates to semiconductor structures and their fabrication. More particularly, the present invention relates to fabrication of semiconductor structures on silicon-on insulator (SOI) substrates in which the structures include isolated ohmic trenches and stand-alone isolation trenches.

Description of Related Art

In the fabrication of High Voltage Silicon on Insulator (HVSOI) semiconductor structures, in order to maintain standard Complementary Metal Oxide Semiconductor (CMOS) well implants and sufficient silicon (Si) for a laterally diffused metal oxide semiconductor (LDMOS) drift region, a relatively thick Si layer in a silicon-on-insulator (SOI) substrate is desired. For example, the final Si layer thickness may preferably be greater than 1 micrometer in an SOI substrate. However, in addition, in the same SOI substrate there is typically a need to have an ohmic electrical contact to bulk silicon (or "handle wafer") from the Si surface of the SOI substrate. Furthermore, there can be a need for a plurality of ohmic trenches to contact a plurality of regions in the bulk silicon that may, or may not, be implanted and which need to be isolated from each other. Moreover, in order to ensure sufficient device-to-device isolation, such substrates also typically require an insulating trench. That is, an insulating trench which can provide appropriate ground rules device-to-device isolation of, for example, about 200 volts (VDC).

SUMMARY OF THE INVENTION

Aspects of the present invention provide semiconductor structures and methods of fabricating semiconductor structures providing ohmic and isolation trenches in an SOI substrate, and may include self-alignment of the trenches. Aspects of the invention may also provide the desired Shallow Trench Isolation (STI) structures, and thereby integrate the advantages and features of SOI and bulk CMOS technologies in a cost effective manner that can reduce the area requirements on the substrate.

One embodiment of the invention is a method of forming a semiconductor structure using a semiconductor-on-insulator (SOI) substrate, the SOI substrate comprising or including: a semiconductor layer; a bulk semiconductor region underlying the semiconductor layer; and an insulation layer between the semiconductor layer and the bulk semiconductor region. The method comprises or includes: substantially simultaneously forming a first opening having sidewalls and a second opening having sidewalls, each of the first opening and the second opening extending from a top surface of the semiconductor layer through the semiconductor layer and through the insulation layer to the bulk semiconductor region; introducing an insulating material to the first opening, the insulating material adapted to provide electrical insulation to at least a portion of the side walls of the first opening at least partially filling the first opening with a semiconductor material to provide an ohmic contact trench to the bulk semiconductor region; and at least partially filling the second opening with an insulating material to form a device isolation trench. In one aspect, the method may include forming insulating regions about the device isolation trench, the ohmic isolation trench, or both. In one aspect, there may be a plurality of ohmic contacts contacting a plurality of regions in the bulk semiconductor region, the regions contacted by the ohmic contact may be doped or undoped.

In one aspect, forming the first opening and the second opening is practiced substantially simultaneously, for example, wherein forming the first opening and the second opening is practiced by substantially simultaneous masking and etching. According to one aspect, the substantially simultaneous masking and etching the first and the second opening provides a "self-aligning" of the first opening and the second opening.

In one aspect, the insulating regions formed may comprise shallow trench isolation (STI) regions. For example, the STI regions may comprise a dielectric material having a thickness of at most a thickness of the semiconductor layer. In another aspect, the STI regions may comprise dielectric material having a depth that does not extend to the bulk semiconductor region. In another aspect, the STI regions may comprise dielectric material having a depth that does not extend through the insulation layer. In another aspect, the STI regions may comprise dielectric material having a depth that does not extend to the insulation layer. In a further aspect, the STI regions may comprise dielectric material having a depth that does not extend through the semiconductor layer.

In one aspect of the invention, the method further comprises growing an epitaxial layer of Si after the ohmic and isolation trenches are formed to reach the final desired SOI layer thickness and to complete the CMOS processing. In another aspect, the device isolation trenches may be contained within shallow trench isolation regions, for example, shallow trench isolation regions comprising a dielectric material having a thickness less than the thickness of the SOI layer.

Another embodiment of the invention is a semiconductor structure formed on a semiconductor-on-insulator (SOI) substrate, the SOI substrate comprising or including: a semiconductor layer; a bulk semiconductor region underlying the semiconductor layer; and an insulation layer between the semiconductor layer and the bulk semiconductor region. The semiconductor structure comprises or includes: a first opening having sidewalls and a second opening having sidewalls, each of the first opening and the second opening formed substantially simultaneously and extending from a top surface of the semiconductor layer through the semiconductor layer and through the insulation layer to the conductive region; an insulating material adapted to provide electrical insulation to at least a portion of the side walls of the first opening; a semiconductor material at least partially filling the first opening, the semiconductor material defining an ohmic contact trench providing electrical contact with the semiconductor region; and an insulating material disposed in the second opening and defining a device isolation trench. In one aspect, the structure further comprises insulating regions about the device isolation trench, the ohmic contact trench, or both. In one aspect, there may be a plurality of ohmic contacts contacting a plurality of regions in the bulk semiconductor region; the regions of the bulk semiconductor region contacted by the ohmic contacts may be doped or undoped.

In another aspect insulating regions about the device isolation trench, the ohmic contact trench may comprise shallow trench isolation regions, as disclosed herein.

In another aspect, the first opening and the second opening of the structure may be formed substantially simultaneously, for example, wherein forming the first opening and the second opening is practiced by substantially simultaneous masking and etching. According to one aspect, the substantially simultaneous masking and etching the first and the second opening provides a "self-aligning" of the first opening and the second opening in the structure.

These and other aspects, features, and advantages of this invention will become apparent from the following detailed description of the various aspects of the invention taken in conjunction with the accompanying drawings

BRIEF DESCRIPTION OF THE DRAWINGS

The subject matter, which is regarded as the invention, is particularly pointed out and distinctly recited in the claims at the conclusion of the specification. The foregoing and other objects, features, and advantages of the invention will be readily understood from the following detailed description of aspects of the invention taken in conjunction with the accompanying drawings in which:

FIG. 23 is a schematic flow diagram of a design process that may be used in semiconductor design, manufacturing, and/or test of aspects of the invention.

DETAILED DESCRIPTION OF ASPECTS OF THE INVENTION

Figure 1:
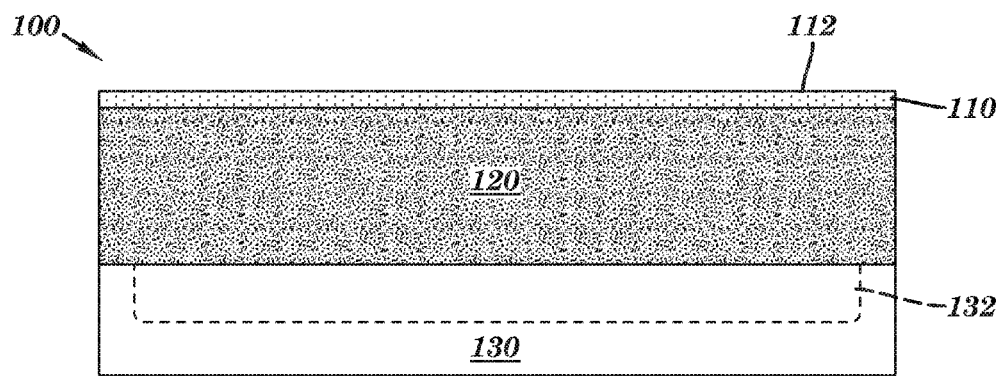
FIGS. 1 through 8 are schematic cross-sectional views of a portion of a substrate during fabrication stages of structures provided by methods according to aspects of the invention.

FIG. 1 is a schematic cross-sectional view of a portion of a substrate or structure 100 upon which aspects the present invention may be provided. Substrate 100 may typically include a plurality of layers, for example, an upper or semiconductor layer 110, an intermediate or buried insulation layer (also known as, a Buried Oxide layer or "BOX" layer) 120, and a "bulk" semiconductor region (or "handle wafer" as known in the art) 130 below the intermediate insulation layer 120. The structures shown in FIG. 1, and in the other figures herein, are not intended to be illustrated to scale, but are dimensioned as shown to facilitate illustration, description, and operation of aspects of the invention. It is to be understood that like references numbers in all figures provided herein refer to similar, if not identical structures, for example, to identical structures to those structures shown in FIG. 1.

Semiconductor substrate 100 shown in FIG. 1 is typically referred to as a "semiconductor-on-insulator" (SOI) substrate in the art, and is recognized in the art as one semiconductor structure that minimizes parasitic capacitance losses and minimizes "latchup" between semiconductor devices mounted in and on semiconductor substrate 100.

According to aspects of the invention, SOI substrate 100 shown in FIG. 1 may be fabricated by any conventional means of fabricating layered structures, for example, deposition, wafer bonding, and/or a "splitting" technique. As is typical in the art, and according to aspects of the invention, the semiconductor layer 110 may comprise a single crystal silicon or a monocrystalline silicon-containing material and define a surface 112. The semiconductor layer 110 may have a thickness ranging from about 10 nanometers [nm] to about 2000 nm. For example, about 145 nm (that is, about 0.145 micrometers [μm]) may be used in an aspect of this invention. However, aspects of the invention may have a thickness less than 10 nm or greater than 2000 nm. The lower or bulk material region 130 may also comprise single crystal silicon or a monocrystalline silicon-containing material. The bulk material region 130, only a representative portion of which is shown in FIG. 1 and in other figures presented herein, may typically be significantly thicker than the semiconductor layer 110, for example, having a thickness ranging from about 300 μm to about 1.5 mm, but typically has a thickness ranging from about 600 μm to about 800 μm.

Buried insulation layer 120 may comprise any conventional dielectric material, for example, silicon dioxide ($SiO_2$), or its equivalent, or sapphire, or its equivalent. The buried insulation layer or BOX layer 120 may have a thickness ranging from about 50 nanometers to about 2000 nm, but typically has a thickness ranging of at least about 1000 nm (that is, at least about 1 μm) nm to about 1500 nm.

According to an aspect of the invention, bulk semiconductor region 130 may comprise a material that is adapted to receive and retain charged particles, as known in the art. That is, in one aspect, the material of bulk semiconductor region 130 may be adapted to be implanted with charged particles, for example, n-type dopants or p-type dopants, when exposed to a stream of charged particles. As known in the art, single crystal silicon or monocrystalline silicon-containing materials, and their equivalents, can be used for bulk semiconductor region 130 to provide the potential for implantation. Region 132 shown in phantom in FIG. 1 is provided to illustrate a typical region in bulk semiconductor region 130 that can be modified by implantation with charged particles.

As known in the art, the semiconductor layer 110 may have a first crystal orientation with crystal planes identified by Miller indices (j,k,l) and the bulk semiconductor region 130 may have a second crystal orientation with crystal planes identified by Miller indices (j',k',l'). For monocrystalline silicon, the respective crystal orientations (j,k,l), (j',k',l') of the semiconductor layer 110 and the bulk semiconductor region 130 may be selected from among (100), (110), and (111) crystal orientations. The first crystal orientation (j,k,l) of the semiconductor layer 110 may differ from the (j',k',l') crystal orientation of the bulk semiconductor region 130. For example, the first crystal orientation (j,k,l) of the semiconductor layer 110 may be a (110) crystal orientation and the second crystal orientation (j',k',l') of the bulk semiconductor region 130 may be a (100) crystal orientation, or vice-versa. In an alternative embodiment, the first and second crystal orientations (j,k,l), (j',k',l') may be substantially identical.

Figure 2:
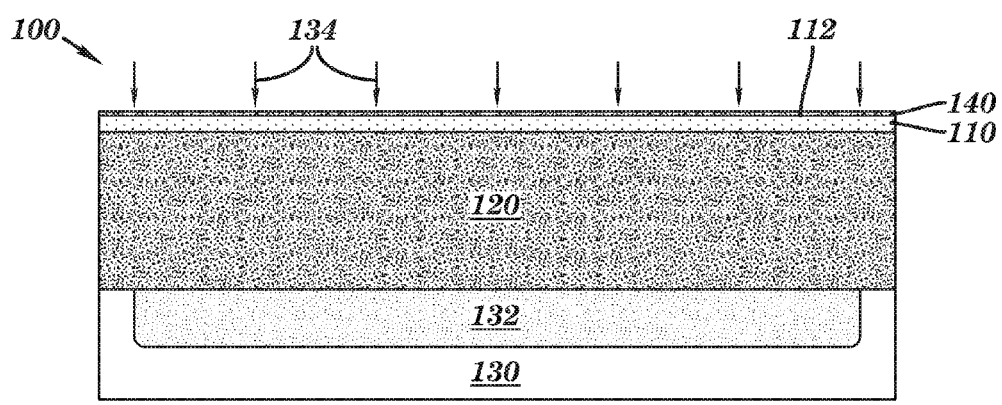

FIG. 2 is a schematic cross-sectional view of the portion of substrate 100 shown in FIG. 1 upon subsequent treatment according to an aspect of the invention. As shown in FIG. 2, surface 112 of semiconductor layer 110 may first be treated with a layer or pad 140. In one aspect, the material of pad 140 may be material that can be selectively removed, for example, by etching, at a later stage of the process of the present invention. In one aspect, pad 140 may be $SiO_2$ having a thickness of about five nm to about 10 nm, for example, about 8 nm (that is, about 80 Angstroms [Å]). Pad 140 may be applied to surface 112 of layer 110 by furnace oxidation, for example, by exposing the semiconductor layer 110 to a dry oxygen ambient or to steam in a heated environment, or pad 140 may be deposited by a conventional deposition process, such as, a thermal chemical vapor deposition (CVD) process, or its equivalent. In one aspect, pad layer 140 may function as a buffer layer, for example, to minimize or prevent any stresses in semiconductor layer 110 from causing dislocations or damage in semiconductor layer 110.

As also shown in FIG. 2, in one aspect, the implantation of ions, as indicated by arrows 134, may be practiced before or after the introduction of layer 140. According to one aspect of the invention, the implantation of ions 134 produces a conductive region 132 in the bulk semiconductor region 130. This conductive region, or "buried" conductive region, 132 may be formed by implanting ions 134, for example, ions formed from a working gas containing an n-type or p-type dopant species, with a substantially normal angle of incidence upon the surface of bulk semiconductor region 130 where the ions 134 impinge and penetrate into the underlying semiconductor material of bulk material 130, and stop in a depth in or about region 132. In one aspect, implant 134 can be a blanket (for example, an unpatterned blanket) implant to create a uniform region across the entire bulk semiconductor. In another aspect, a resist mask (not shown) can be applied to create regions in the bulk semiconductor as depicted by region 132.

Typically, according to aspects of the invention, buried conductive region 132 comprises a different dopant concentration from the bulk semiconductor region 130 or a conductivity type opposite to the conductivity type of bulk semiconductor region 130. Region 130 can also be further patterned to have a plurality of regions of different dopant concentration and types from the bulk and from each other. For example, when bulk semiconductor region 130 is doped with a p-type dopant species to render semiconductor region 130 with p-type conductivity, the ions 134 in FIG. 2 may comprise an n-type dopant species (for example, arsenic or phosphorus) implanted at a kinetic energy effective to position buried conductive region 132 at a depth beneath the surface of bulk semiconductor region 130. The ion dose and kinetic energy may be chosen accordingly, as is known in the art, to provide a buried conductive region 132 with a conductivity opposite the conductivity of the bulk semiconductor region 130.

Figure 3:
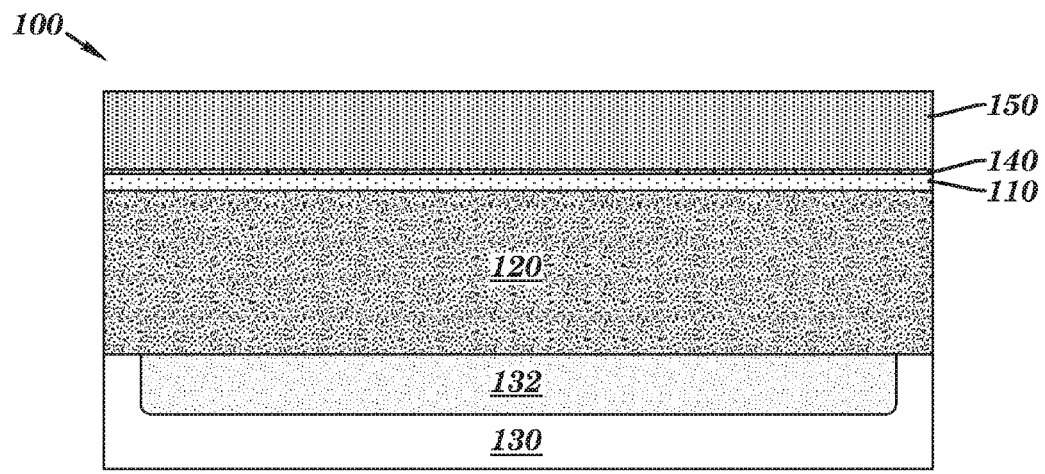

FIG. 3 is a schematic cross-sectional view of the portion of substrate 100 shown in FIG. 2 upon subsequent treatment according to an aspect of the invention. As shown in FIG. 3, a mask 150 may be applied to the surface of substrate 110, for example, a hardmask, such as, a silicone nitride ($Si_3N_4$, "nitride") hardmask, as known in the art. In one aspect, mask 150 may comprise a material that can be selectively removed, for example, by etching, at a later stage of the process of the present invention. Mask 150 may have a thickness of about 100 nm to about 1000 nm, for example, about 500 nm (that is, about 0.5 μm). Mask 150 may be deposited by a thermal CVD process, such as, a low-pressure chemical vapor deposition (LPCVD) or a plasma-assisted CVD process, among others. In one aspect, mask 150 is provided to provide a subsequent link to other structures according to aspects of the invention, for example, to structures associated with "shallow trench isolation" (STI) structures, and equivalent structures. In another aspect, mask 150 may be sized to reduce the topography associated with the epitaxial growth of the Si to provide a relatively more planar final surface.

Figure 4:
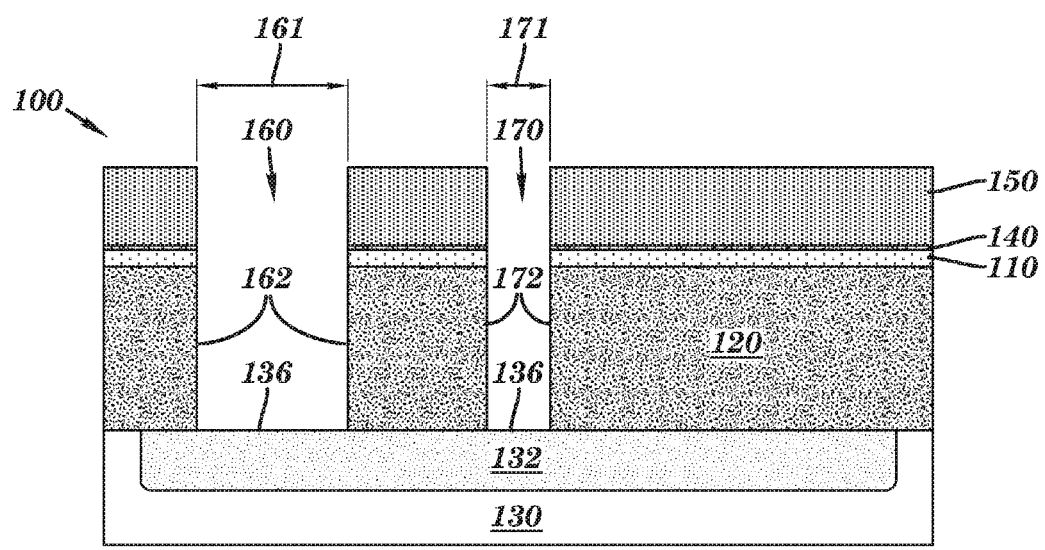

FIG. 4 is a schematic cross-sectional view of the portion of substrate 100 shown in FIG. 3 upon subsequent treatment according to an aspect of the invention. According to aspects of the invention, as shown in FIG. 4, trenches or openings 160 and 170 are formed in substrate 100 through mask 150, pad layer 140, semiconductor layer 110, and buried insulation layer 120 by a conventional lithography and etching process, for example, a process that utilizes a pattern imparted in mask 150. The pattern may be created in mask 150 by applying a resist (not shown) on mask 150, exposing the resist to a pattern of radiation to create a latent pattern in the resist, and developing the latent pattern in the exposed resist. In one aspect, an anisotropic dry etching process, such as reactive-ion etching (RIE) or plasma etching, may then be used to transfer the pattern from the patterned resist into mask 150. However, in one aspect of the invention, openings 160 and 170 may be formed without the use of a photomask.

According to aspects of the invention, the etching process may be a single etching step or a plurality of etching steps, for example, employing varying etching chemistries. The etching process removes portions of mask 150, pad layer 140, semiconductor layer 110, and buried insulation layer 120, for example, through the pattern in the patterned resist and substantially stops on top surface 134 of bulk semiconductor region 130. After etching is concluded, residual resist may be stripped from mask 150 by, for example, plasma ashing or a chemical stripper.

In one aspect of the invention, openings or trenches 160 and 170 may be formed substantially simultaneously, for example, in the very same etching process. According to this aspect, since only a single etching process may be used in forming trenches 160 and 170, for example, formed using a single mask, such as, mask 150, the relative positions of trenches 160 and 170 may be well-defined and unlikely to deviate from the relative position defined by the mask. In contrast, for example, when subsequent etches are used to provide two or more trenches, relative positioning or alignment of the trenches can deviate from the desired positioning or alignment. However, by employing a single etching process, according to one aspect of the invention, the relative misalignment or mis-positioning of trenches 160 and 170 may be minimized, if not prevented. According to aspects of the invention, a substantially simultaneous formation of trenches 160 and 170 can be provided due to the substantially uniform structure and/or chemistry of semiconductor layer 110, buried insulation layer 120, and/or pad layer 140 in the regions where trenches 160 and 170 are formed. For example, this substantially uniform structure and/or chemistry semiconductor layer 110, buried insulation layer 120, and/or pad layer 140 permits trenches 160 and 170 to be substantially simultaneously provided with substantially the same single-step or multiple-step etching chemistry. Moreover, the substantially simultaneous formation of trenches 160 and 170 can facilitate and/or simply the structure fabrication process.

In one aspect of the invention, the formation of trenches 160 and 170 in a single-step or multi-step process may be referred to as "self-aligning," and aspects of the invention may be referred to as a "self-aligning" method and/or structure.

Trench 160 may have a depth of between about 200 nm and about 5000 nm, but typically has a depth of between 1000 nm and about 2000 nm. Trench 160 may have a width 161 of between about 100 nm and about 3000 nm, but typically has a width 161 of between 500 nm and about 1500 nm. Trench 170 may have a depth of between about 200 nm and about 5000 nm, but typically has a depth of between 1000 nm and about 2000 nm. Trench 170 may have a width 171 of between about 100 nm and about 3000 nm, but typically has a width 171 of between 500 nm and about 1500 nm. However, typically the depths of trench 160 and trench 170 will be a function of the thicknesses of layers 150, 140, 110, and 120, for example, whereby trenches 160 and 170 penetrate layers 150, 140, 110, and 120 to expose buried conductive region 132. In one aspect, trench 160 and/or trench 170 may extend into region 132, for example, past the surface 136 of regions 130 and/or 132.

As shown in FIG. 4, in one aspect of the invention, trench 160 may have a width 161 that is wider than the width 171 of trench 170. For example, in one aspect, trench 160 may have a lower "aspect ratio" (depth/width) than trench 170. According to one aspect of the invention, the width 161 of trench 160 may be at least 25% greater than the width 171 of trench 170; however, in other aspects, width 161 may be at least 50%, 100%, or 200% greater than the width 171. As shown more clearly with respect to FIGS. 5 and 6, the greater width of "ohmic" trench 160 compared to the width of "isolation" trench 170, for example, in one aspect, the sidewalls of a wider trench 160 may act as a mask during subsequent processing which can simplify the subsequent processing.

Trenches 160 and 170 in substrate 100 may take the form of trenches and provide accesses or "windows" extending through the thickness of semiconductor layer 110 and buried insulation layer 120 and exposing a respective surface area of bulk semiconductor region 130. Trenches 160 and 170 include opposite sidewalls 162, 172, respectively, that extend through mask 150, semiconductor layer 110, and buried insulation layer 120 to a bottom surface or base 134 that is substantially coextensive with, intersects, or extends within the bulk semiconductor region 130. The sidewalls 162, 172 may be substantially parallel and may be oriented substantially perpendicular to the top surface 136 of bulk semiconductor region 130. According to aspects of the invention, trenches 160 and 170 may isolate, that is, electrically isolate, a plurality of adjacent semiconductor regions in semiconductor layer 110 and may isolate a plurality of buried insulator regions in buried insulation layer 120.

Figure 5:
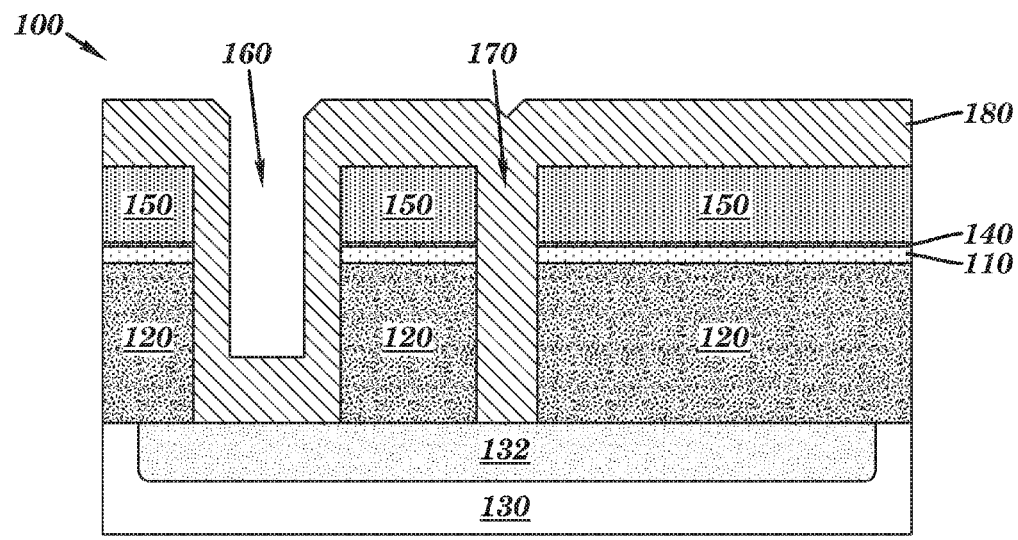

FIG. 5 is a schematic cross-sectional view of the portion of the substrate 100 shown in FIG. 4 upon subsequent treatment according to an aspect of the invention. According to aspects of the invention, as shown in FIG. 5, a conformal layer 180 of an electrically insulating or dielectric material, such as, SiO$_2$ or its equivalent, is deposited on to substrate 100 by conventional means. As shown in FIG. 5, dielectric layer 180 may at least partially fill trenches 160 and 170 and substantially cover the surface of substrate 100. As shown in FIG. 5, trench 170 may be substantially completely filled by dielectric layer 180. Dielectric layer 180 may have a thickness ranging from about 10 nm to about 1000 nm, but is typically between about 400 nm and about 600 nm in thickness, for example, about 500 nm.

Figure 6:
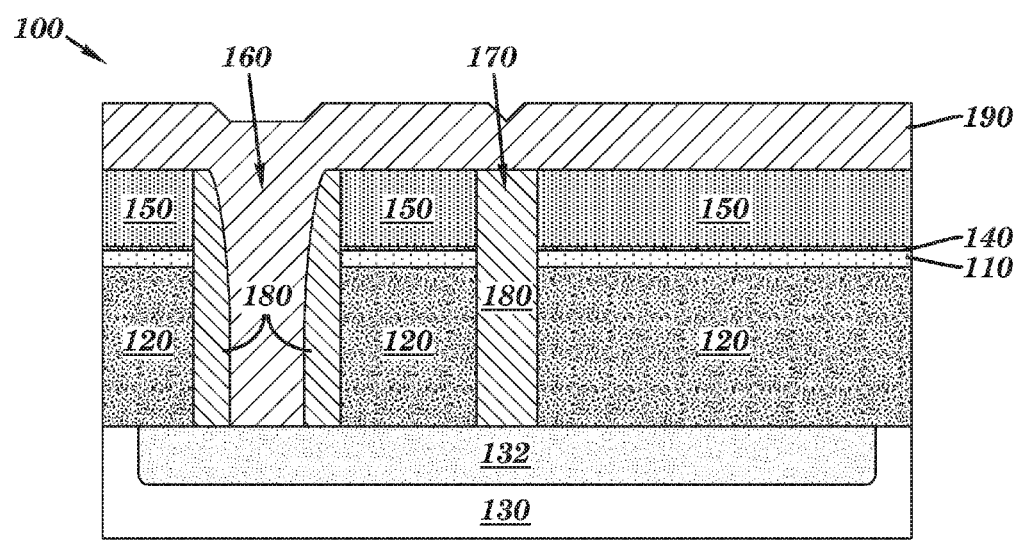

FIG. 6 is a schematic cross-sectional view of the portion of the substrate 100 shown in FIG. 5 upon subsequent treatment according to an aspect of the invention. According to aspects of the invention, as shown in FIG. 6, a portion of the dielectric layer 180 deposited at the base of trench 160, as shown in FIG. 5, may be removed, for example, by using a conventional etching process. For example, a layer of resist (not shown) may be applied to substrate 100 and then patterned using a conventional lithography process to expose trench 160. An anisotropic etching process may be used to etch dielectric layer 180 from the base of trench 160. The anisotropic etching process may be conducted in a single etching step or multiple etching steps, for example, with different etch chemistries. As shown in FIG. 6, the etching process removes a portion of dielectric layer 180 from trench 160 and exposes at least a portion of buried conductive region 132.

As noted earlier with respect to FIG. 4, as shown in FIGS. 5 and 6, in one aspect, the width of trench 160 may be greater than the width of trench 170. Accordingly, during the application of the conformal dielectric layer 180, though trench 170 may typically be substantially completely filled with dielectric 180, wider trench 160 may typically be only partially filled. In one aspect, trench 170 may be "over filled" and trench 160 may be "under filled" during the application of conformal dielectric layer 180. According to one aspect of the invention, this partial or under filling of trench 160 due to the greater width of trench 160 may effectively provide dielectric material 180 to the sidewalls and base of trench 160 but leave a void or via within the trench 160. Accordingly, according to an aspect of the invention, as shown most clearly in FIG. 6, dielectric material 180 on the sidewalls of trench 180 may act as a mask, that is, substantially shielding the sidewalls of trench 160 while not shielding (that is, exposing) the base of trench 160 for further treatment. For example, in one aspect, the under filling of trench 160 due to its larger width can enhance the selectivity of a subsequent etching process, for instance, an anisotropic etching process, by providing dielectric 180 to the side walls of trench 180—which shields the side walls of trench 160—while allowing access by the etching chemistry to the base of trench 160 to more effectively yield the desired material removal. For instance, in one aspect, no further masking of the surface of trench 160 may be required.

As indicated in FIG. 6, the resulting etched surface of substrate 100 may then be planarized, for example, by means of a conventional chemi-mechanical planarization (CMP) process that is adapted to provide a surface to mask 150. In one aspect, the etching process may yield a sufficiently planar surface that no CMP process may be needed. As shown in FIG. 6, a layer of conductive material 190, for example, polycrystalline silicon (polysilicon or "poly"), is deposited onto substrate 100 by conventional means, for example by a CVD process. Conductive material 190 typically at least partially fills the remaining void in trench 160, including contacting buried conductive layer 132, and substantially covers the dielectric 180 in trench 170. Conductive material, or poly layer, 190 may have a thickness ranging from about 10 nm to about 1000 nm, but is typically between about 200 nm and about 400 nm in thickness, for example, about 300 nm.

Figure 7:
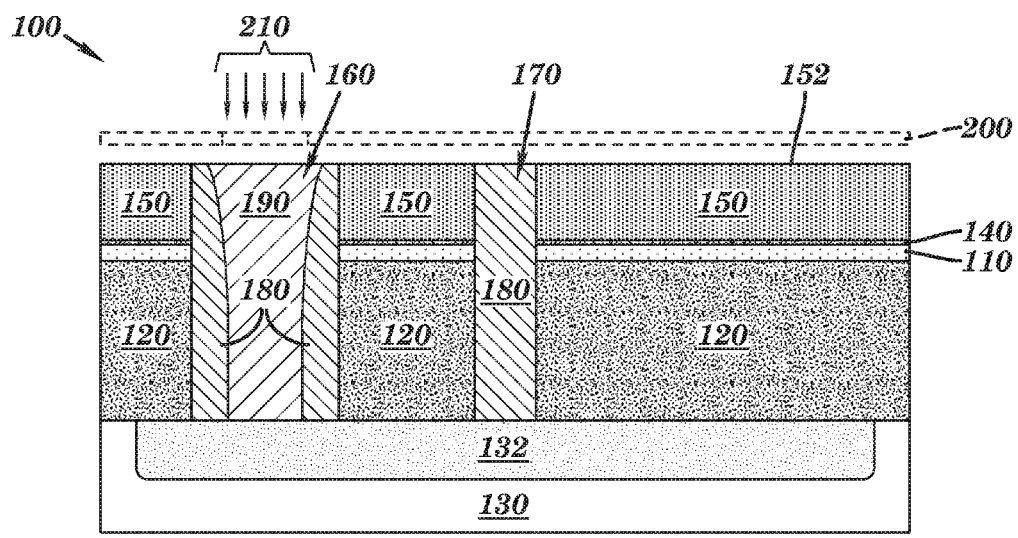

FIG. 7 is a schematic cross-sectional view of the portion of the substrate 100 shown in FIG. 6 upon subsequent treatment according to an aspect of the invention. According to aspects of the invention, as shown in FIG. 7, the surface of substrate 100 is first planarized, for example, by one or more conventional CMP processes, the planarized surface 152 is then masked by mask 200 (shown in phantom), and then conductive material 190 in trench 160 is doped, that is, implanted with ions, as indicated by arrows 210, for example, n-type ions. It will be understood that in one aspect of the invention, the doping of conductive material 190 may be practiced in situ, that is, during the introduction of conductive material 190 into opening 160, or post fill, as described above.

Figure 8:
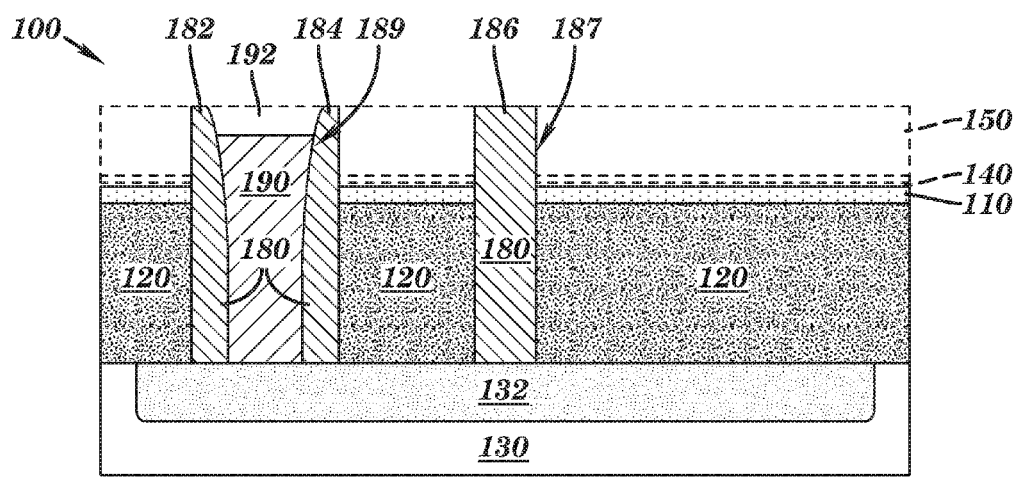

FIG. 8 is a schematic cross-sectional view of the portion of the substrate 100 shown in FIG. 7 upon subsequent treatment according to an aspect of the invention. According to aspects of the invention, as shown in FIG. 8, a portion 192 of doped conductive material 190 in trench 160 is removed, for example, by a conventional selective removal process. Then, mask 150, for example, the nitride layer (shown in phantom in FIG. 8), and pad layer 140 (shown in phantom in FIG. 8) are removed, for example, by a conventional etching process, for example, by a reactive ion etch (RIE), to produce projections 182, 184, and 186 of dielectric material 180 from the surface of semiconductor layer 110 of substrate 100.

FIG. 8 illustrates one structure in substrate 100 that may be provided according to one aspect of the invention. Specifically, as shown in FIG. 8, an isolation trench 187, and an ohmic contact trench 189 to buried conductive region 132 are provided in a SOI substrate 100, for example, an SOI substrate 100 having a buried insulation layer 120. However, further aspects of the invention, for example, those incorporating further electrical isolation structures, for instance, shallow trench isolation (STI) structures, are disclosed in the following figures.

Figure 9:
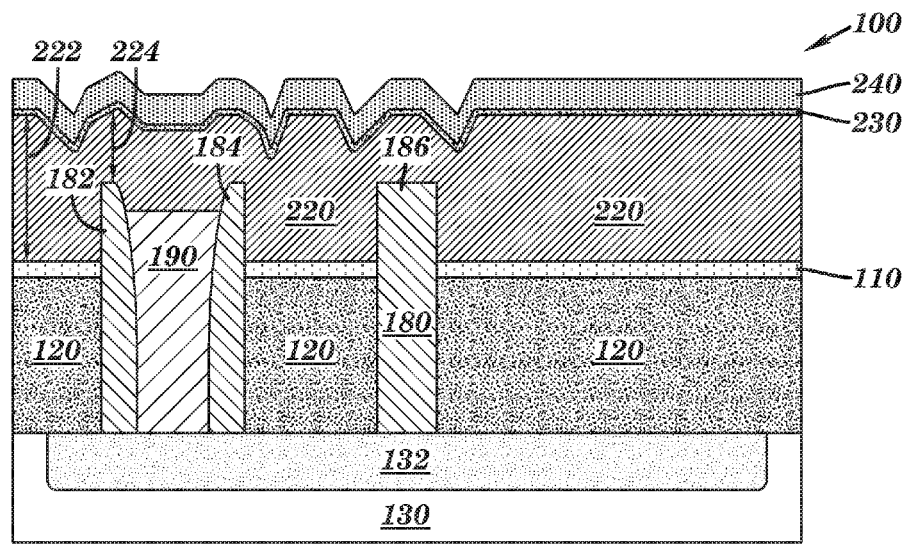
FIGS. 9 through 11 are schematic cross-sectional views of the portion of the substrate shown in FIG. 8 during fabrication stages of structures provided by methods according to further aspects of the invention.

FIG. 9 is a schematic cross-sectional view of the portion of the substrate 100 shown in FIG. 8 upon subsequent treatment according to an aspect of the invention. According to aspects of the invention, as shown in FIG. 9, substrate 100 is treated sequentially with an epitaxial growth of a layer of silicon 220 upon the existing semiconductor layer 110 and dielectric projections 182, 184, and 186; next, the application of a dielectric layer 230, for example, $SiO_2$ or its equivalent; and, then, the application of a mask layer 240, for example, of a $Si_3N_4$ (nitride) or its equivalent. The epitaxial growth of silicon layer 220 on layer 110 may be practiced by conventional means, for example, by a selective epitaxial growth (SEG) process, or its equivalent. The epitaxial growth process may be practiced at sub-atmospheric pressures and with a substrate temperature between about 850 degrees C. and about 1050 degrees C. The silicon sources that may be used in the epitaxial growth process may include, but are not limited to, silicon tetrachloride ($SiCl_4$), trichlorosilane ($SiHCl_3$), or dichlorosilane ($SiH_2Cl_2$), or their equivalents. In one aspect, the typical SEG process may be practiced at a sub-atmospheric pressure of about 40 Torr absolute and at a substrate temperature of about 900 degrees C.

The thickness of silicon layer 220 may vary from about 100 nm to about 2000 nm (that is, about 2 µm), but may typically be between about 400 nm and about 1200 nm. According to aspects of the invention, it is understood that the rate of epitaxial growth of silicon layer 220 may vary on different materials of substrate 100 such that the thickness of silicon layer 220 may vary along the surface of substrate 100. For example, the epitaxial growth rate of silicon layer 220 on semiconductor layer 110 (which may also be substantially silicon) may be greater, that is, faster, than the growth rate of silicon on dielectric projections 182, 184, and 186 (which may be substantially $SiO_2$). Specifically, in one aspect, the rate of growth of silicon layer 220 on semiconductor layer 110 may be about twice (that is, 2 times) the rate of the growth of layer 220 on dielectric projections 182, 184, and 186. For example, in a given time, the thickness 222 of the silicon layer 220 grown on semiconductor layer 110 may be about 1000 nm (that is, about 1 µm) while the thickness 224 of the silicon layer 220 grown on dielectric projections 182, 184 for the same given time may be about half of the thickness 222, that is, about 500 nm (that is, about 0.5 µm).

In one aspect, the combined thickness of the semiconductor layer 110 and the silicon layer 220 is at least one µm, and may preferably be greater than 1 µm, for example, between about 1 µm and about 3 µm. According to some aspects of the invention, this relatively thick silicon layer, as noted above, can permit the maintenance of CMOS well implants and provide sufficient Si for LDMOS drift regions.

As also shown in FIG. 9, the application of a layer or pad of dielectric 230, for example, $SiO_2$, may also be practiced by conventional means. For example, in one aspect, the dielectric layer may be provided to the surface of silicon layer 220 by epitaxial growth by exposing the semiconductor layer 110 to a dry oxygen ambient or to steam in a heated environment, or be deposited by a conventional deposition process, such as, a thermal CVD process. The thickness of the layer of pad 230 may range from about 10 Å to about 500 Å, but is typically, between about 50 Å and 100 Å, for example, about 80 Å.

Mask layer 240, for example, a nitride layer, may also be provided by conventional means. For example, in one aspect, mask layer 240 may be deposited by a thermal CVD process, such as, a LPCVD process or a plasma-assisted CVD process, among others. Mask layer 240 may have a thickness of about 100 Å to about 2000 Å, but is typically between about 1000 Å and about 1500 Å, for example, about 1200 Å (that is, about 120 nm).

In one aspect, mask layer 240 is provided to provide a subsequent link to other structures according to aspects of the invention, for example, to structures associated with STI structures, or equivalent structures, for instance, to one or more insulating trenches.

Figure 10:
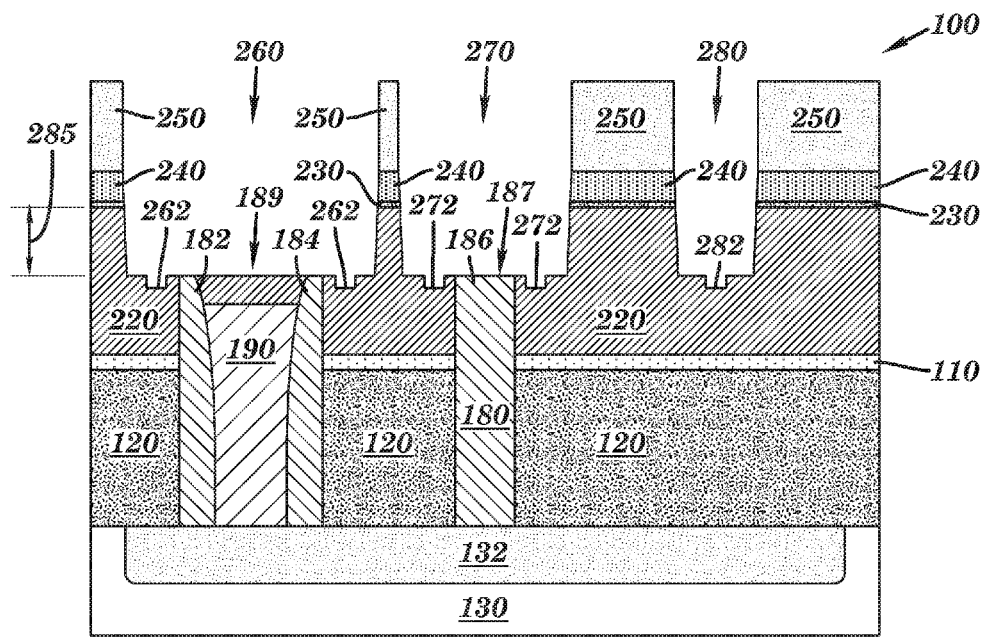

FIG. 10 is a schematic cross-sectional view of the portion of substrate 100 shown in FIG. 9 upon subsequent treatment according to an aspect of the invention. According to one aspect, as shown in FIG. 10, openings or trenches 260, 270, and 280 are introduced to substrate 100. In one aspect, trenches 260, 270, and 280 may be referred to as "shallow trench isolation" trenches, or simply STI trenches. For example, in one aspect, the depth 285 below the surface of silicon layer 220 of trenches 260, 270, and 280 may range from about 0.2 µm to about 2.0 µm, but is typically between about 0.4 µm and about 0.8 µm, for example, about 0.6 µm. In another aspect, trenches 260, 270, and 280 have depths that terminate within silicon layer 220, for example, as shown in FIG. 10, trenches 260, 270, and 280 terminate above the interface of the silicon layer 220 with buried insulation layer 120. According to one aspect of the invention, the trenches 260, 270, and 280 may have a depth that is at most the thickness of the silicon layer 220. In one aspect, the depth of trenches 260, 270, and 280 may not extend through the semiconductor layer 220. In a further aspect, the depth of trenches 260, 270, and 280 may not extend to the insulation layer 120. In another aspect, the depth of trenches 260, 270, and 280 may not extend through the insulation layer 120. Further still, in another aspect, the depth of trenches 260, 270, and 280 may not extend to the bulk semiconductor region 130 or to the buried doped conductive region 132.

Trenches 260, 270, and 280 may be provided in substrate 100 by conventional means, for example, by one or more masking and etching processes. In one aspect, as shown in FIG. 10, the etching process may be practiced with an appropriate mask 250, for example, Si$_3$N$_4$ mask, or its equivalent.

According to aspects of the invention, trenches 260, 270, and 280 are sufficiently deep to expose isolation trench 187 and ohmic contact trench 189 (see FIG. 8). As shown in FIG. 10, trench 260 may typically be provided to expose at least some of dielectric projections 182 and 184 of ohmic contact trench 189; trench 270 may typically expose dielectric projection 186 of isolation trench 187; and trench 280 may extend into silicon layer 220. As shown in FIG. 10, the depth and topography of the base of trenches 260, 270, and 280 may vary, for example, having depressions 262, 272, and 282, respectively, due to the variation of the initial topography of the substrate 100 (as shown in FIG. 9).

Figure 11:
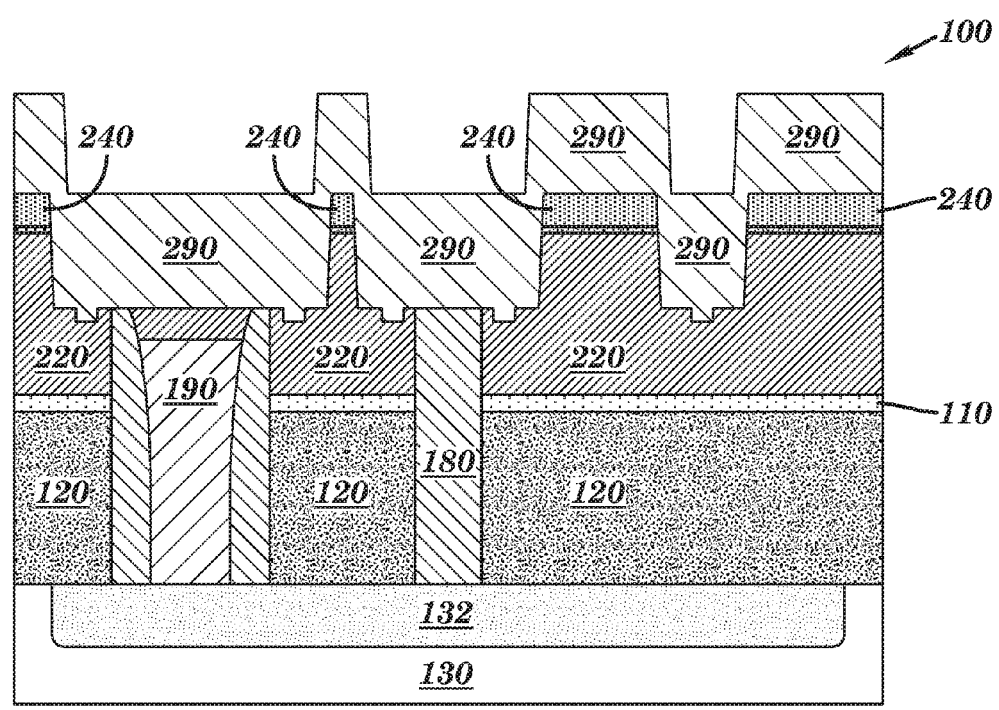

FIG. 11 is a schematic cross-sectional view of the portion of substrate 100 shown in FIG. 10 upon subsequent treatment according to an aspect of the invention. According to aspects of the invention, mask 250 shown in FIG. 10 (and not shown in FIG. 11) is removed from substrate 110 prior to further processing. Mask 250 may be removed by conventional means, for example, by an etching process. As shown in FIG. 11, according to aspects of the invention, a conformal layer 290 of an electrically insulating or dielectric material, such as, SiO$_2$ or its equivalent, may be deposited on to substrate 100 by conventional means. As shown in FIG. 11, dielectric layer 290 may at least partially fill trenches or openings 260, 270, and 280 (see FIG. 10). In one aspect, dielectric layer 90 provides "STI trench fill." Dielectric layer 290 may have a thickness ranging from about 10 nm to about 1000 nm, but is typically between about 400 nm and about 600 nm in thickness, for example, about 500 nm.

According to aspects of the invention, substrate 100 shown in FIG. 11 provides one platform upon which further aspects of the invention may be provided. FIGS. 12 through 16 provide one series of treatments of substrate 100 shown in FIG. 11 according to one aspect of the invention. FIGS. 17 through 20 provide another series of treatments of substrate 100 shown in FIG. 11 according to another aspect of the invention.

Figure 12:
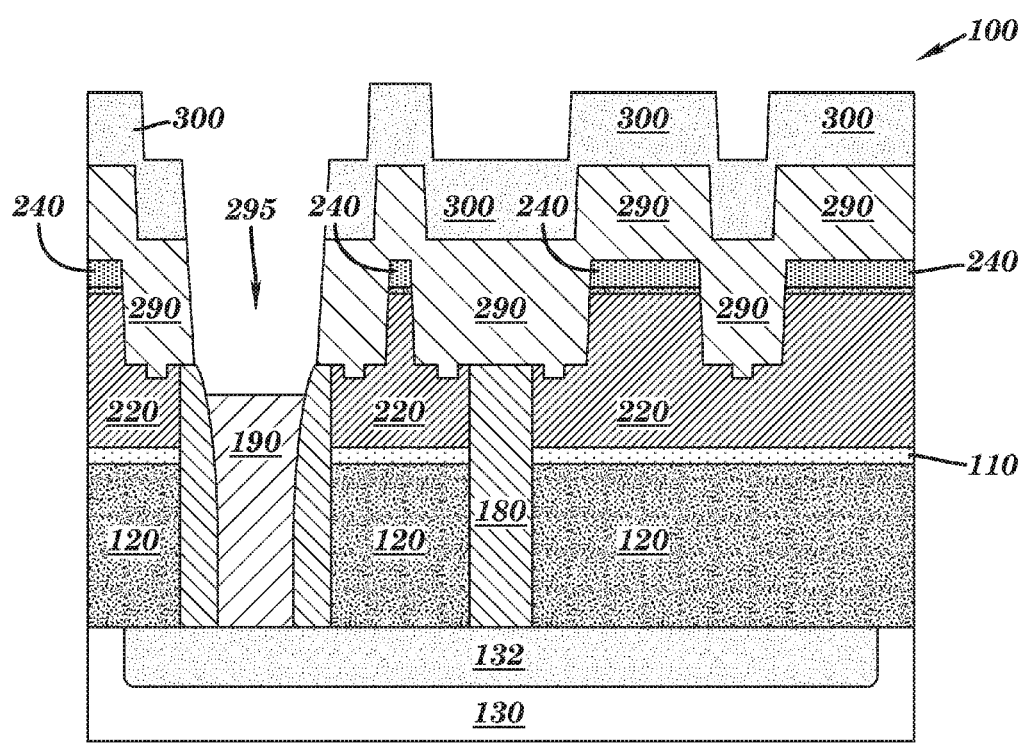
FIGS. 12 through 16 are schematic cross-sectional views of the portion of the substrate shown in FIG. 8 during fabrication stages of structures provided by methods according to further embodiments of the invention.

FIG. 12 is a schematic cross-sectional view of the portion of the substrate 100 shown in FIG. 11 upon subsequent treatment according to an aspect of the invention. According to this aspect, as shown in FIG. 12, opening or trench 295 is introduced to substrate 100. As shown in FIG. 12, trench 295 may typically extend through dielectric layer 290, through silicon layer 220, and at least partially expose doped conductive material 190. Trench 295 may be provided in substrate 100 by conventional means, for example, by a masking and an etching process. In one aspect, as shown in FIG. 12, the etching process may be practiced with an appropriate mask 300, for example, Si$_3$N$_4$ mask or its equivalent.

Figure 13:
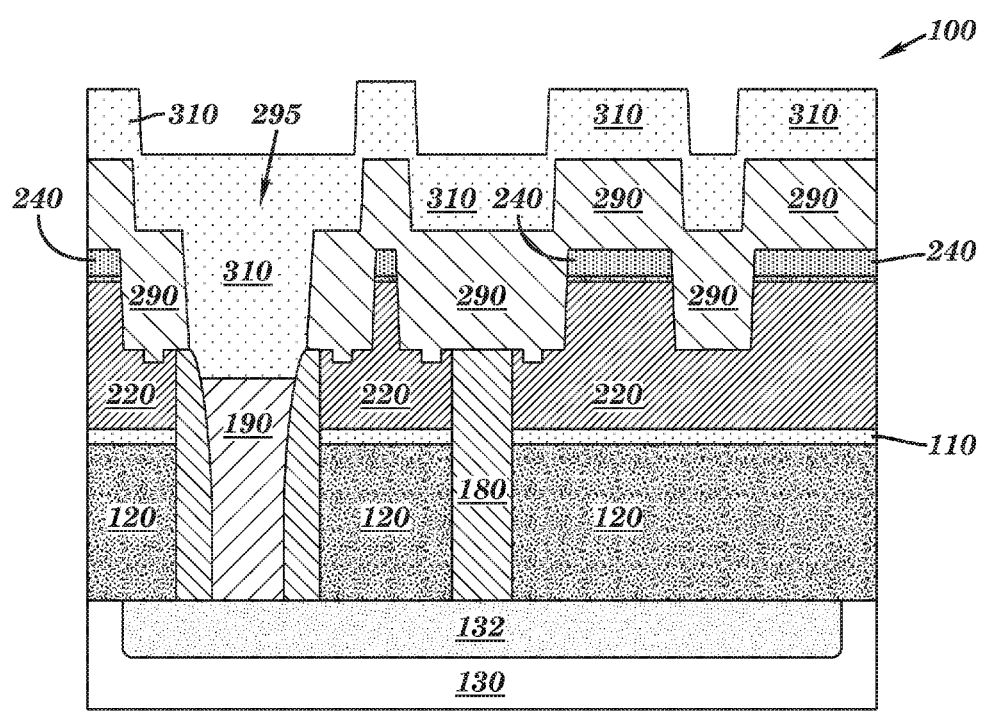

FIG. 13 is a schematic cross-sectional view of the portion of substrate 100 shown in FIG. 12 upon subsequent treatment according to an aspect of the invention. According to aspects of the invention, as shown in FIG. 13, a layer of conductive material 310, for example, polycrystalline silicon (polysilicon or "poly") is deposited onto substrate 100 by conventional means, for example, by a CVD process. Conductive material 310 typically at least partially fills trench 295 and substantially covers doped conductive material 190 at the bottom of trench 295. Conductive material or poly layer 310 may have a thickness ranging from about 10 nm to about 1000 nm, but is typically between about 200 nm and about 400 nm in thickness, for example, about 300 nm.

Figure 14:
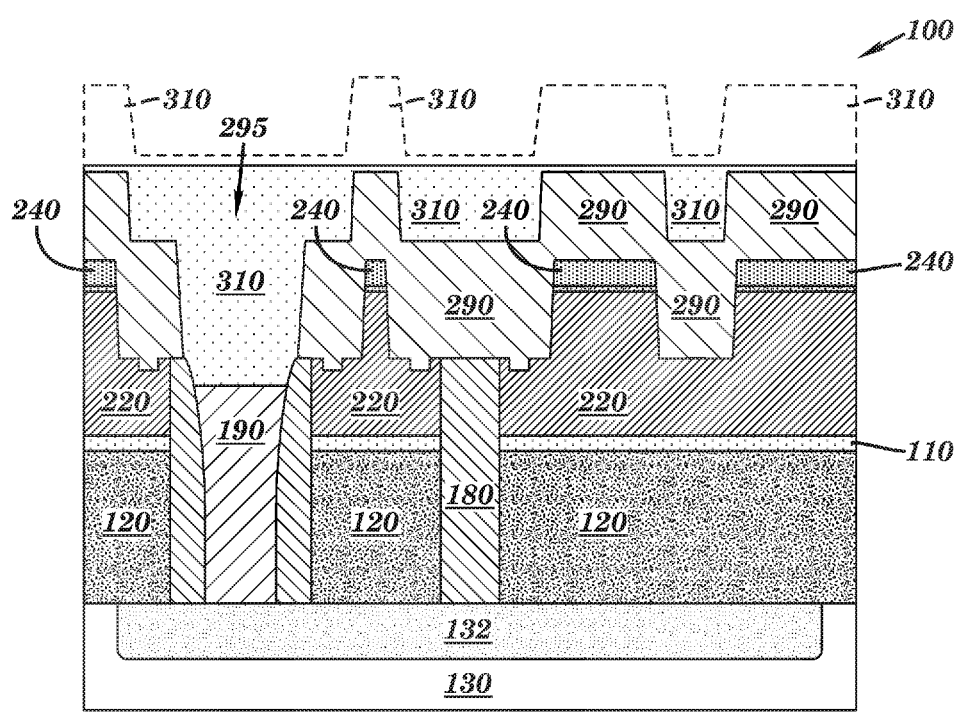

FIG. 14 is a schematic cross-sectional view of the portion of substrate 100 shown in FIG. 13 upon subsequent treatment according to an aspect of the invention. According to aspects of the invention, as shown in FIG. 14, the surface of substrate 100 is planarized and/or polished, for example, by one or more conventional CMP processes, to remove at least some of the conductive material or poly layer 310 (the contour of the removed material 310 is shown in phantom in FIG. 14 for reference).

Figure 15:
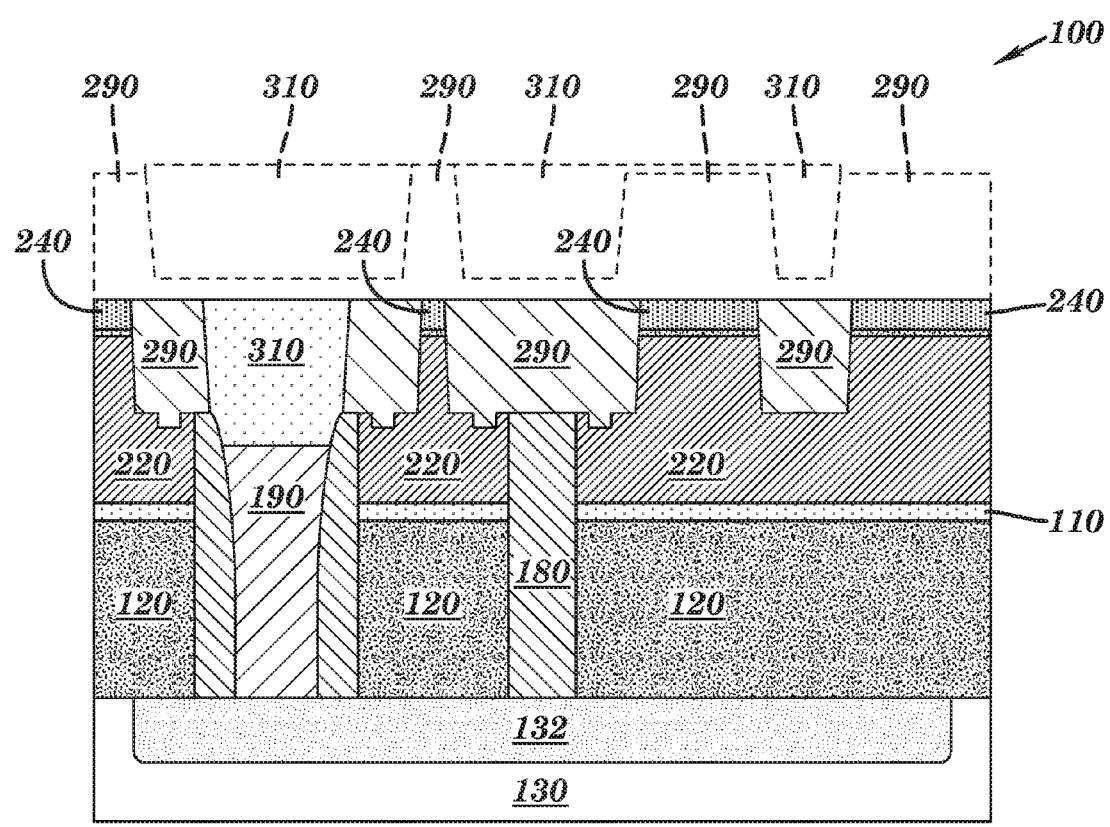

FIG. 15 is a schematic cross-sectional view of the portion of substrate 100 shown in FIG. 14 upon subsequent treatment according to an aspect of the invention. According to this aspect of the invention, as shown in FIG. 15, the surface of substrate 100 is planarized, for example, by one or more conventional CMP processes, to remove at least some of the dielectric layer 290 and at least some of conductive material, or poly layer, 310 (the contours of the removed dielectric layer 290 and the removed poly layer 310 are shown in phantom in FIG. 15 for reference) to expose a planarized surface of mask layer 240 (for example, Si$_3$N$_4$), dielectric layer 290, and poly layer 310.

Figure 16:
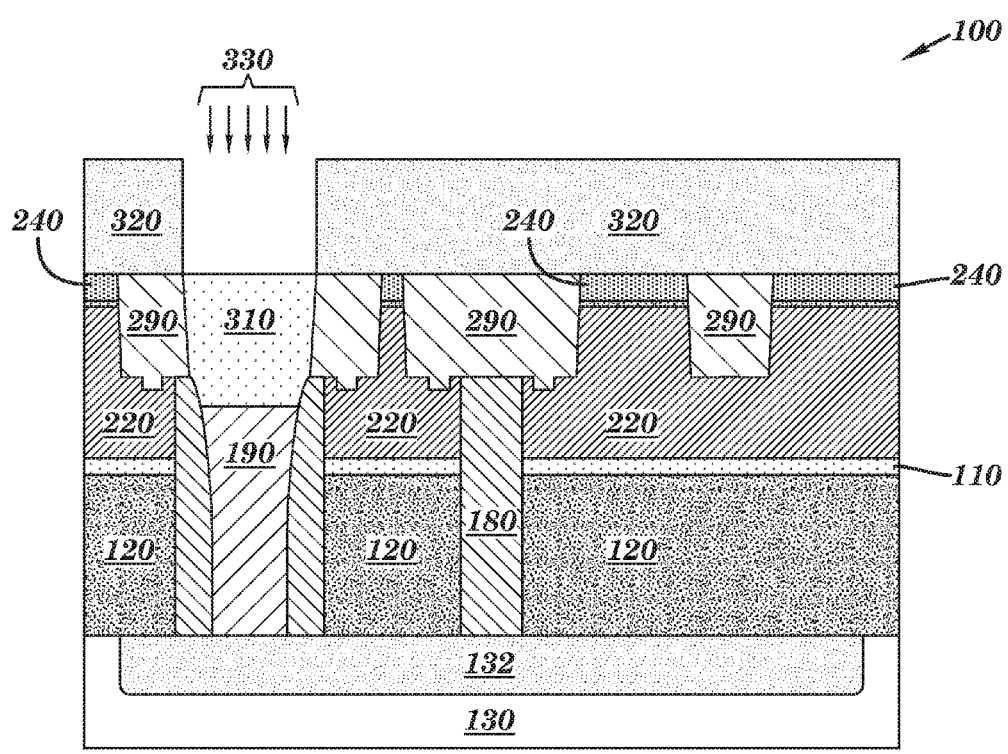

FIG. 16 is a schematic cross-sectional view of the portion of substrate 100 shown in FIG. 15 upon subsequent treatment according to an aspect of the invention. According to aspects of the invention, as shown in FIG. 16, the planarized surface of substrate 100 is then masked by mask 320, for example, a nitride mask, and then conductive material 310 in trench 295 is implanted with ions as indicated by arrows 330, for example, n-type ions. It will be understood that in one aspect of the invention, the doping of conductive material 310 may be practiced in situ, that is, during the introduction of conductive material 310 into opening 295, or post fill, as described above.

The structure of substrate 100 shown in FIG. 16 comprises one semiconductor structure that may be produced according to one aspect of the invention. According to this aspect, with the removal of mask 320 and the removal of mask 240, according to conventional practice, the semiconductor structure 400 shown in FIG. 21 (as discussed below) may be produced.

Figure 17:
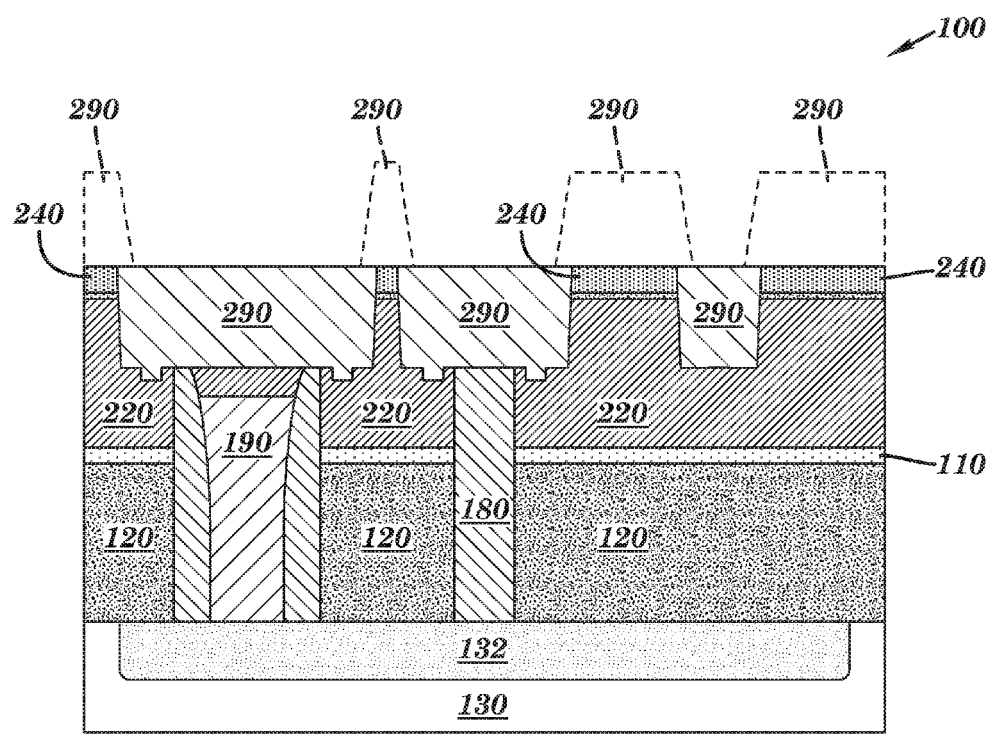
FIGS. 17 through 20 are schematic cross-sectional views of the portion of the substrate shown in FIG. 8 during fabrication stages of structures provided by methods according to further embodiments of the invention.

FIG. 17 is a schematic cross-sectional view of the portion of substrate 100 shown in FIG. 11 upon subsequent treatment according to an aspect of the invention. According to this aspect, as shown in FIG. 17, the surface of substrate 100 shown in FIG. 11 is planarized, for example, by one or more conventional CMP processes, to remove at least some of the dielectric layer 290 and at least some of the mask layer 240 (the contour of the removed dielectric layer 290 and is shown in phantom in FIG. 17 for reference) to expose a planarized surface of mask layer 240 (for example, Si$_3$N$_4$) and dielectric layer 290.

Figure 18:
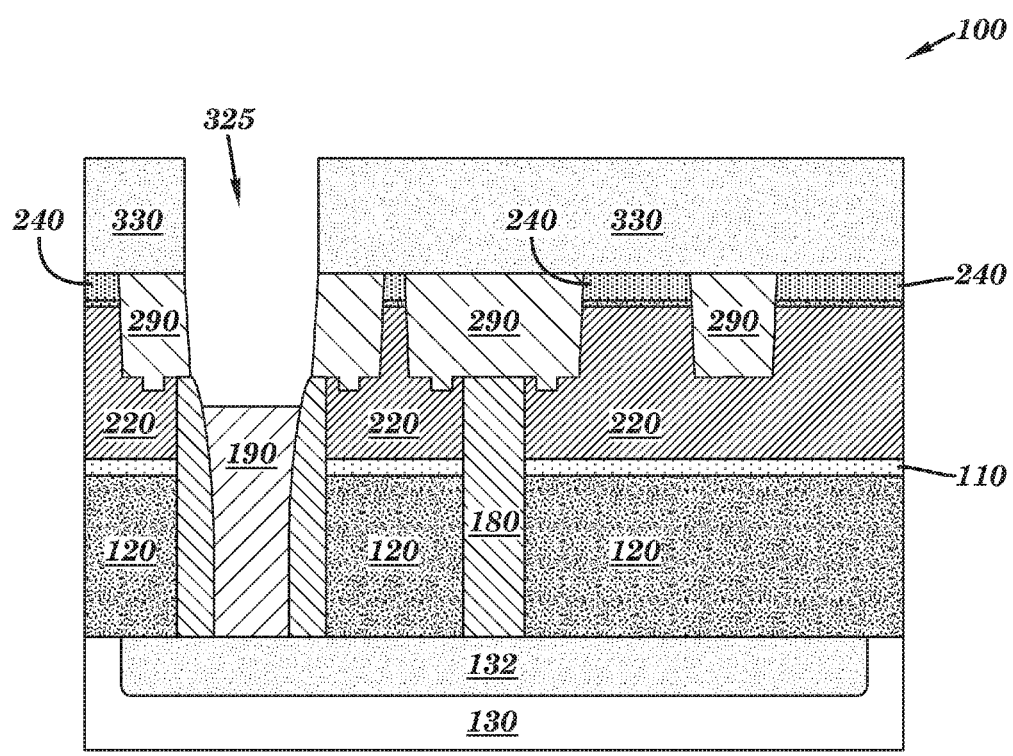

FIG. 18 is a schematic cross-sectional view of the portion of the substrate 100 shown in FIG. 17 upon subsequent treatment according to an aspect of the invention. According to this aspect, as shown in FIG. 18, opening or trench 325 is introduced to substrate 100. As shown in FIG. 18, trench 325 may typically extend through dielectric layer 290, through silicon layer 220, and at least partially, expose doped conductive material 190. Trench 325 may be provided in substrate 100 by conventional means, for example, by a masking and an etching process. In one aspect, as shown in FIG. 18, the etching process may be practiced with an appropriate mask 330, for example, Si$_3$N$_4$ mask or its equivalent.

Figure 19:
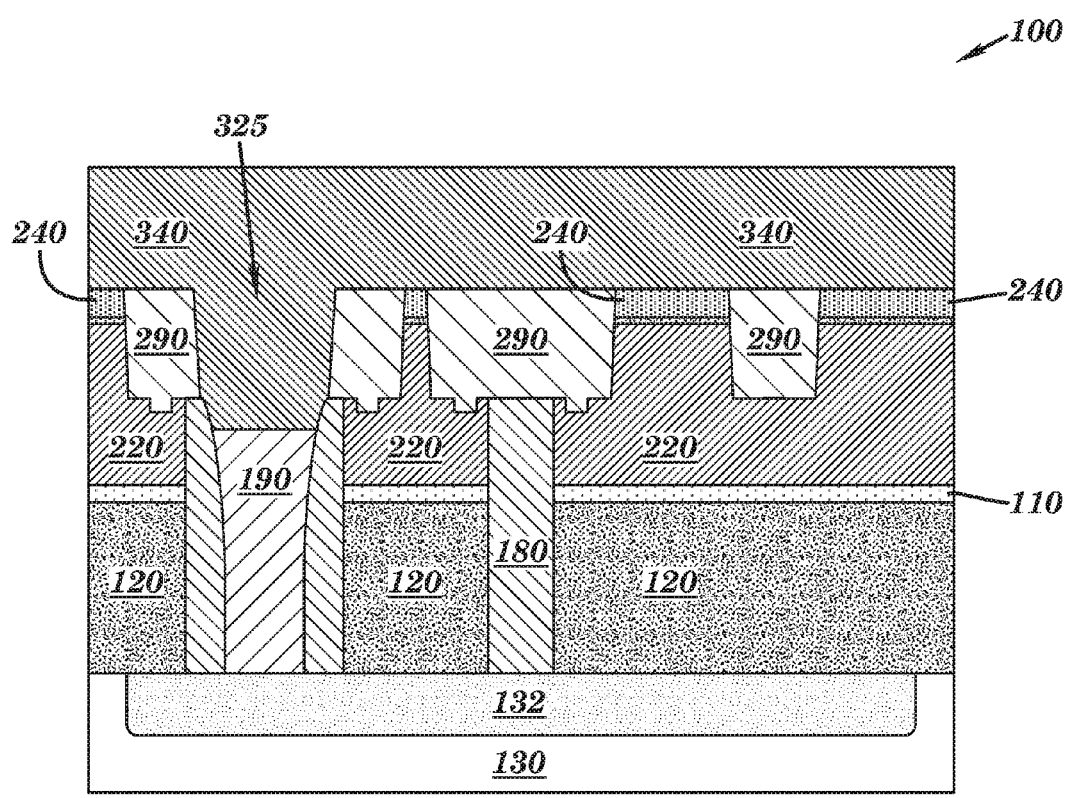

FIG. 19 is a schematic cross-sectional view of the portion of substrate 100 shown in FIG. 18 upon subsequent treatment according to an aspect of the invention. According to this aspect, as shown in FIG. 19, a layer of conductive material 340, for example, polycrystalline silicon (polysilicon or "poly"), is deposited onto substrate 100 by conventional means, for example, by a CVD process. Conductive material 340 typically at least partially fills trench 325 and substantially covers the doped conductive material 190 at the bottom of trench 325. Conductive material or poly layer 340 may have a thickness ranging from about 10 nm to about 1000 nm, but is typically between about 200 nm and about 400 nm in thickness, for example, about 300 nm.

Figure 20:
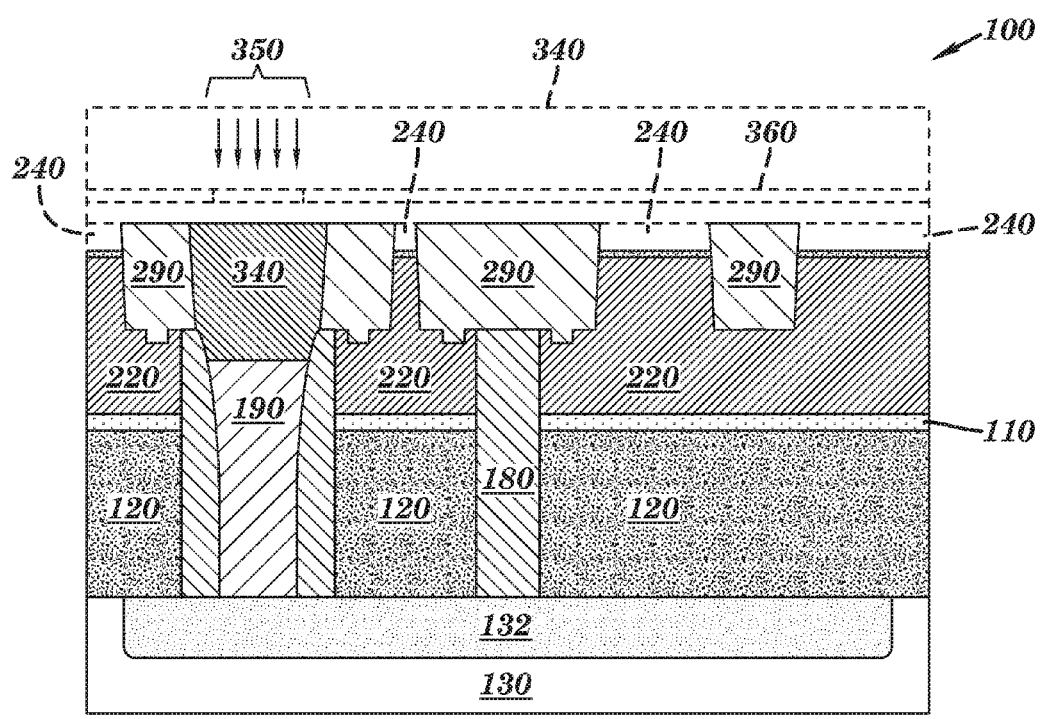

FIG. 20 is a schematic cross-sectional view of the portion of substrate 100 shown in FIG. 19 upon subsequent treatment according to an aspect of the invention. According to this aspect, as shown in FIG. 20, the surface of substrate 100 is first planarized, for example, by one or more conventional CMP processes, to remove at least some of the conductive material (for example, poly) 340, at least some of the dielectric material 290 (the contour of the removed material 290 shown in phantom in FIG. 20 for reference), and possibly at least some of the mask 240 (shown in phantom in FIG. 20 for reference) to expose the planarized surface of substrate 100. According to an aspect of the invention, conductive material 340 in trench 325 is then implanted with ions as indicated by arrows 350, for example, n-type ions. The implantation with ions 350 may be practiced with a mask mask 360 (also shown in phantom in FIG. 20). Again, in one aspect of the invention, the doping of conductive material 340 may be practiced in situ, that is, during the introduction of conductive material 340 into opening 325, or post fill, as described above. Mask 240 (shown in phantom in FIG. 20) may also be removed to yield the substrate 400 shown in FIG. 21.

Figure 21:
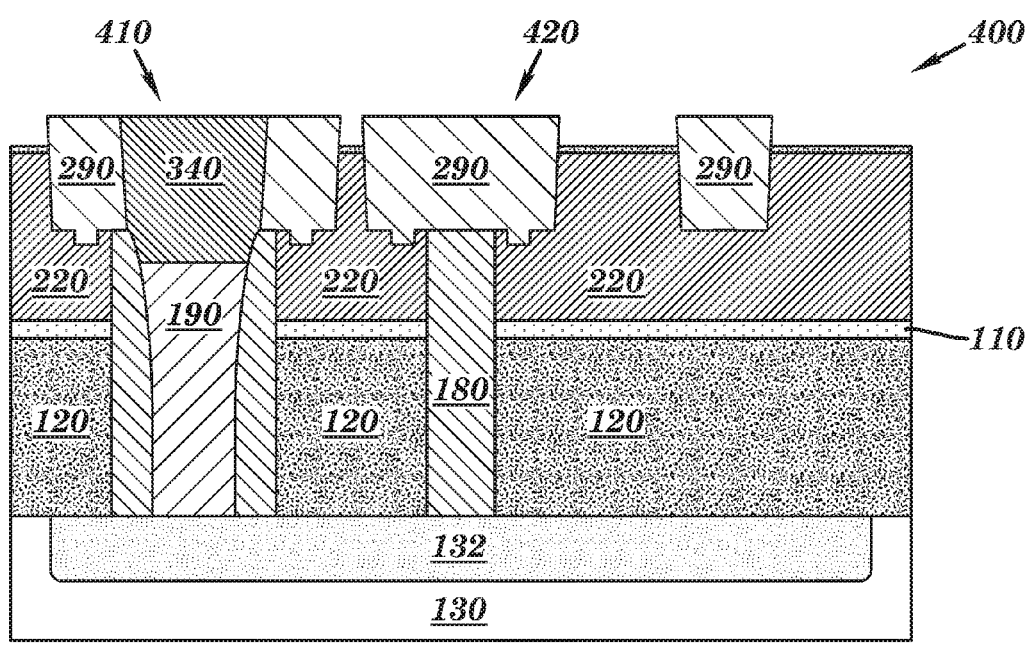
FIGS. 21 and 22 are schematic cross-sectional views of the portion of the substrate shown in FIGS. 16 and 20, respectively, during fabrication stages of structures provided methods according to further embodiments of the invention.

FIG. 21 is a schematic cross-sectional view of the portion of a substrate 400 which may be produced via the methods illustrated in FIGS. 12 through 16 and/or in FIGS. 17 through 20 according to aspects of the invention. As shown in FIG. 21, the structure in substrate 400 includes an ohmic contact trench 410 comprising doped conductive material 190, for example, doped polysilicon, and doped conductive material 340, for example, doped polysilicon; and a device isolation trench 420 comprising dielectric material 180, for example, SiO$_2$, in a "silicon-on-insulator" (SOI) substrate. As shown, SOI substrate includes a semiconductor layer comprising semiconductor layer 220, for example, silicon grown on semiconductor layer 110, for example, silicon; a buried insulation layer 120, for example, SiO$_2$; and a bulk semiconductor region 130, for example, silicon, having a buried doped conductive region 132. As also shown in FIG. 21, at least one of, but typically both, ohmic contact trench 410 and device isolation trench 420 may be insulated, for example, electrically insulated from adjacent semiconductor components (not shown) by dielectric material 290, for example, SiO$_2$. The insulating structures of material 290 may be referred to as "shallow trench isolation" (STI) structures. Accordingly, aspects of the present invention provide methods of fabricating semiconductor structures and semiconductor structures 410 and 420 that provide the advantages of both deep trench ohmic connectivity and shallow trench isolation in an SOI substrate.

Figure 22:
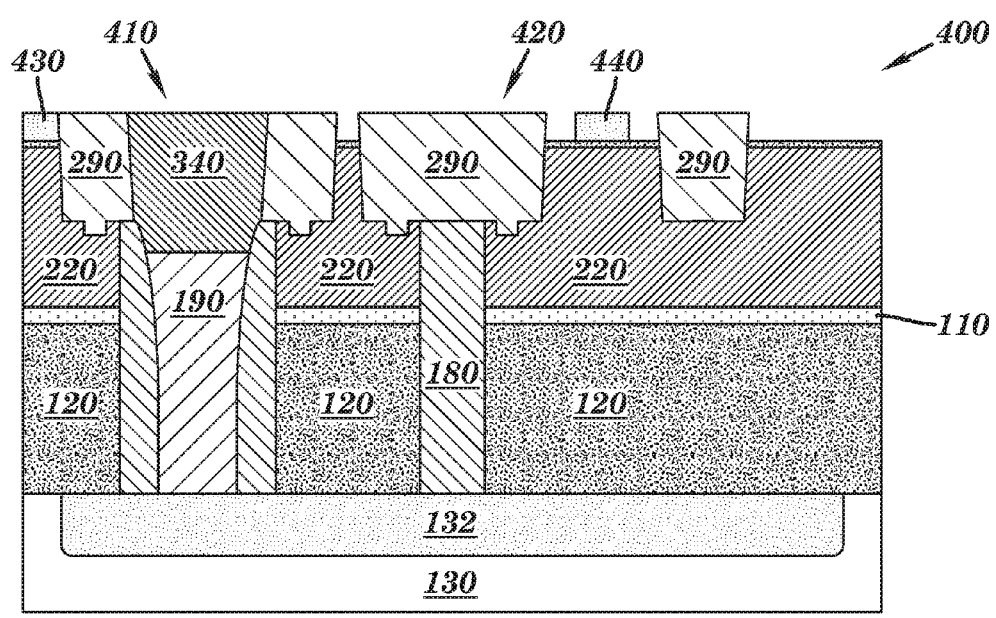

FIG. 22 is a schematic cross-sectional view of the portion of the substrate 400 shown in FIG. 21 upon subsequent treatment according to an aspect of the invention. According to aspects of the invention, as shown in FIG. 21, electrodes 430 and 440, among others, may be provided to the surface of substrate 400 to provide semiconductor devices, for example, for one or more integrated circuits. The devices may comprise any type of conventional device structure including, but not limited to, field effect transistor (FET), such as, for example, n-channel metal oxide semiconductor (MOS) FET's, P-channel MOS FET's, complimentary metal oxide semiconductor (CMOS) FET's, and bipolar transistors, such as, lateral bipolar transistors. The processing steps required to fabricate these semiconductor devices and the mode of operation of these devices will be apparent to those of skill in the art.

FIG. 23 is a schematic flow diagram of a design process 500 used in semiconductor design, manufacturing, and/or test of aspects of the invention shown in the figures described above. Design flow process 500 may vary depending on the type of integrated circuit (IC) being designed. For example, a design flow 500 for building an application specific IC (ASIC) may differ from a design flow 500 for designing a standard component. Design structure 502 may be an input to a design process 504 and may come from an IP provider, a core developer, or other design company, or may be generated by the operator of the design flow process 500, or from other sources. Design structure 502 may comprise a circuit incorporating transistors in the form of schematics or HDL, a hardware-description language (for example, Verilog, VHDL, C, among others.). Design structure 502 may be contained on one or more machine-readable medium. For example, design structure 502 may be a text file or a graphical representation of the circuit. Design process 504 may synthesize (or translate) the circuit into a netlist 506, where netlist 506 is, for example, a list of wires, transistors, logic gates, control circuits, I/O, models, among others, that describes the connections to other elements and circuits in an integrated circuit design and recorded on at least one machine readable medium. This may be an iterative process in which netlist 506 is resynthesized one or more times, depending on design specifications and parameters for the circuit.

Design process 504 may include using a variety of inputs, for example, inputs from library elements 508 which may house a set of commonly used elements, circuits, and devices, including models, layouts, and symbolic representations, for a given manufacturing technology (for example, different technology nodes, 32 nm, 45 nm, 90 nm, among others), design specifications 510, characterization data 512, verification data 514, design rules 516, and test data files 518 (which may include test patterns and other testing information). Design process 504 may further include, for example, standard circuit design processes, such as, timing analysis, verification, design rule checking, place and route operations, among others. A person having ordinary skill in the art of integrated circuit design can appreciate the extent of possible electronic design automation tools and applications used in design process 504 without deviating from the scope of the invention. In addition, the design structure of the invention is not limited to any specific design flow.

Design process 504 preferably translates at least one embodiment of the invention as shown the figures, for example, in FIGS. 8, 11, 21, and/or 22, along with any additional integrated circuit design or data (if applicable), into a second design structure 520. Design structure 520 may reside on a storage medium in a data format used for the exchange of layout data of integrated circuits (for example, information stored in a GDSII (GDS2), GL1, OASIS, or any other suitable format for storing such design structures). Design structure 520 may comprise information, such as, for example, test data files, design content files, manufacturing data, layout parameters, wires, levels of metal, vias, shapes, data for routing through the manufacturing line, and any other data required by a semiconductor manufacturer to produce at least one embodiment of the invention as shown in the figures, for example, in FIGS. 8, 11, 21, and/or 22. Design structure 520 may then proceed to a stage 530 where, for example, design structure 520, proceeds to tape-out, is released to manufacturing, is released to a mask house, is sent to another design house, or is sent back to the customer, among other uses.

While several aspects of the present invention have been described and depicted herein, alternative aspects may be effected by those skilled in the art to accomplish the same or similar objectives. Accordingly, it is intended by the appended claims to cover all such alternative aspects as fall within the true spirit and scope of the invention.

The invention claimed is:

1. A semiconductor structure formed on a semiconductor-on-insulator (SOI) substrate, the SOI substrate including:
   a semiconductor layer;
   a bulk semiconductor region underlying the semiconductor layer and including a conductive region therein; and
   an insulation layer between the semiconductor layer and the bulk semiconductor region;
the structure including:
   a first opening having sidewalls and a second opening having sidewalls extending from a top surface of the semiconductor layer through the semiconductor layer and through the insulation layer to the conductive region of the bulk semiconductor region, wherein a lateral width of the first opening is greater than a lateral width of the second opening;
   a first insulating material laterally abutting the sidewalls of the first opening and providing electrical insulation thereto;
   a first doped conductive material at least partially filling the first opening and directly contacting the first insulating material on opposing lateral sides thereof, and contacting an underlying portion of the conductive region, such that the first doped conductive material is electrically coupled to the underlying portion of the conductive region;
   a second doped conductive material contacting and overlying the first doped conductive material, the first doped conductive material and the second doped conductive material defining an ohmic contact trench;
   a second insulating material filled within the second opening, the second insulating material defining a device isolation trench, wherein a lower surface of the second insulating material contacts and overlies a lower surface of the second opening, and wherein the second insulating material contacts the sidewalls of the second opening; and
   a dielectric material contacting and overlying the second insulating material, such that an upper surface of the dielectric material is positioned above the top surface of the semiconductor layer, the dielectric material defining a first shallow trench isolation (STI) structure.

2. The semiconductor structure as recited in claim 1, wherein the structure further comprises a second shallow trench isolation structure about the ohmic contact trench.

3. The semiconductor structure as recited in claim 2, wherein the first and the second shallow trench isolation structures have a thickness of at most a thickness of the semiconductor layer.

4. The semiconductor structure as recited in claim 2, wherein the semiconductor layer includes a first semiconductor layer and wherein the structure further includes a second semiconductor layer adjacent the first semiconductor layer, and wherein the first and the second shallow trench isolation regions are positioned within the second semiconductor layer.

5. The semiconductor structure as recited in claim 4, wherein the first and the second shallow trench isolation regions are positioned within the second semiconductor layer and the first and the second shallow trench isolation regions have a depth terminating within the second semiconductor layer.

6. The semiconductor structure as recited in claim 1, wherein the first opening and the second opening are self-aligned.

7. The semiconductor structure as recited in claim 1, wherein the semiconductor layer includes a first semiconductor layer and a second semiconductor layer adjacent the first semiconductor layer; wherein the second semiconductor layer includes a second semiconductor layer epitaxially grown on the first semiconductor layer.

8. The semiconductor structure as recited in claim 1, wherein the lateral width of the first opening is between approximately 1000 nanometers (nm) and approximately 2000 nm, and wherein the lateral width of the second opening is between approximately 100 nm and approximately 300 nm.

9. The semiconductor structure as recited in claim 1, wherein the first and second insulating materials include a same material composition.

10. The semiconductor structure as recited in claim 1, wherein a height of the second insulating material above the bulk semiconductor region is greater than a height of the device isolation trench above the bulk semiconductor region.

11. The semiconductor structure as recited in claim 10, wherein a height of the first insulating material above the bulk semiconductor region is greater than a height of the insulation layer above the bulk semiconductor region.

* * * * *